United States Patent
Sato et al.

(10) Patent No.: US 10,229,912 B2
(45) Date of Patent: Mar. 12, 2019

(54) SEMICONDUCTOR DEVICE

(71) Applicant: ADVANTEST CORPORATION, Tokyo (JP)

(72) Inventors: Taku Sato, Miyagi (JP); Kazuya Uryu, Miyagi (JP); Kazuyuki Shouji, Miyagi (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/570,486

(22) PCT Filed: Apr. 18, 2016

(86) PCT No.: PCT/JP2016/062214
§ 371 (c)(1),
(2) Date: Oct. 30, 2017

(87) PCT Pub. No.: WO2016/194494
PCT Pub. Date: Dec. 8, 2016

(65) Prior Publication Data
US 2018/0151568 A1    May 31, 2018

(30) Foreign Application Priority Data
Jun. 2, 2015    (JP) ................................ 2015-111897

(51) Int. Cl.
*H01L 27/095*    (2006.01)
*H01L 29/78*    (2006.01)
(Continued)

(52) U.S. Cl.
CPC .......... *H01L 27/095* (2013.01); *H01L 27/098* (2013.01); *H01L 29/0843* (2013.01);
(Continued)

(58) Field of Classification Search
CPC . H01L 27/095; H01L 27/098; H01L 29/0843; H01L 29/42316; H01L 29/78;
(Continued)

(56) References Cited

U.S. PATENT DOCUMENTS

| 4,663,547 A | 5/1987 | Baliga et al. |
| 8,587,031 B2 | 11/2013 | Lu |

(Continued)

FOREIGN PATENT DOCUMENTS

| JP | 11-26776 | 1/1999 |
| JP | 2000-183363 | 6/2000 |

(Continued)

OTHER PUBLICATIONS

Official Communication issued in International Bureau of WIPO Patent Application No. PCT/JP2016/062214, dated Jun. 7, 2016.
(Continued)

*Primary Examiner* — Joseph Galvin, III
(74) *Attorney, Agent, or Firm* — Greenblum & Bernstein, P.L.C.

(57) ABSTRACT

According to the present invention, a semiconductor device includes a semiconductor layer, a source electrode provided in the semiconductor layer, a drain electrode provided in the semiconductor layer and disposed away from the source electrode, a first gate electrode provided between the source electrode and the drain electrode and a second gate electrode provided between the source electrode and the drain electrode, the second gate electrode having at least a part thereof located closer to the drain electrode than the first gate electrode. The semiconductor layer includes a first facing part that is a part facing the first gate electrode; and a second facing part that is a part facing the second gate electrode. The first facing part does not conduct when a first gate
(Continued)

voltage is 0 V or less. The second facing part does not conduct when a second gate voltage is 0 V or less.

9 Claims, 16 Drawing Sheets

(51) Int. Cl.
| | | |
|---|---|---|
| *H01L 27/098* | (2006.01) | |
| *H01L 29/808* | (2006.01) | |
| *H01L 29/812* | (2006.01) | |
| *H01L 29/08* | (2006.01) | |
| *H01L 29/423* | (2006.01) | |
| *H01L 29/417* | (2006.01) | |
| *H01L 29/778* | (2006.01) | |
| *H01L 29/207* | (2006.01) | |
| *H01L 29/10* | (2006.01) | |
| *H01L 29/20* | (2006.01) | |

(52) U.S. Cl.
CPC ...... *H01L 29/207* (2013.01); *H01L 29/41766* (2013.01); *H01L 29/4236* (2013.01); *H01L 29/42316* (2013.01); *H01L 29/42376* (2013.01); *H01L 29/7786* (2013.01); *H01L 29/78* (2013.01); *H01L 29/808* (2013.01); *H01L 29/812* (2013.01); *H01L 29/1029* (2013.01); *H01L 29/1066* (2013.01); *H01L 29/2003* (2013.01)

(58) Field of Classification Search
CPC . H01L 29/808; H01L 29/812; H01L 29/1029; H01L 29/1066
See application file for complete search history.

(56) References Cited

U.S. PATENT DOCUMENTS

| | | | |
|---|---|---|---|
| 2010/0097105 A1 | 4/2010 | Morita et al. | |
| 2011/0193171 A1 | 8/2011 | Yamagiwa et al. | |
| 2012/0146046 A1 | 6/2012 | Ohki et al. | |
| 2012/0235156 A1 | 9/2012 | Kuraguchi | |
| 2013/0020614 A1* | 1/2013 | Lu ................... | H01L 29/42316 257/194 |
| 2013/0256753 A1 | 10/2013 | Morizuka et al. | |
| 2013/0292699 A1 | 11/2013 | Ueno et al. | |
| 2014/0151747 A1* | 6/2014 | Jeon ................ | H01L 29/42316 257/194 |
| 2015/0263103 A1* | 9/2015 | Saito ................ | H01L 29/7787 257/76 |

FOREIGN PATENT DOCUMENTS

| | | |
|---|---|---|
| JP | 2011-165749 | 8/2011 |
| JP | 2011-243978 | 12/2011 |
| JP | 2012-156164 | 8/2012 |
| JP | 2012-195506 | 10/2012 |
| JP | 2013-207081 | 10/2013 |
| JP | 2014-187085 | 10/2014 |

OTHER PUBLICATIONS

Office Action dated Aug. 24, 2018 by the Taiwanese Patent Office in Taiwanese Patent Application No. 105112017, pp. 1-6.

* cited by examiner

SEMICONDUCTOR DEVICE

TECHNICAL FIELD

The present invention relates to a normally-off type field effect transistor.

BACKGROUND ART

Conventionally, normally-off type and normally-on type field effect transistors are known.

In the normally-off type field effect transistor, when a threshold voltage is 0 V or positive while a gate voltage is 0 V a drain current does not flow (in an off state). Such a normally-off type field effect transistor is suitable for protecting external circuits before turning on a power source or upon power loss.

Meanwhile, in the normally-on type field effective transistor, when a threshold voltage is negative while a gate voltage is 0 V, a drain current flows (in an on state). The normally-on type field effect transistor has good characteristics, such as a high breakdown voltage or a low on-resistance, compared to the normally-off type field effect transistor.

For this reason, there is a known field effect transistor that includes a combination of a normally-off type E (enhancement)-mode field effect transistor and a normally-on type D (depletion)-mode field effect transistor (see Patent Documents 1, 2, 3, and 4). Such a combined field effect transistor is of the normally-off type as a whole, but achieves high breakdown voltage and low on-resistance.

Referring to, for example, FIG. 3A and a third column, lines 5-10 in Patent Document 1, a field effect transistor is known to include a combination of a field effect transistor with Vth,2<0 V (whose threshold voltage is negative and which is of the normally-on type) and another field effect transistor with |Vth,2|<Vbk,1 (whose threshold voltage Vbk,1 is positive and which is of the normally-off type).

Referring to, for example, FIG. 1 and paragraphs [0020] and [0022] in Patent Document 2, a second recess 4 is of the normally-on type, while a first recess 8 is of the normally-off type.

Regarding the second recess 4, it is desirable to see the paragraph [0022] in Patent Document 2, specifically, "the depth of a second recess is adjusted such that a two-dimensional electron gas layer is formed with a gate 5 floating" and "even when an off-voltage is applied to the gate 5, a two-dimensional electron gas layer is formed if a high voltage is not applied to a drain electrode 18". In the vicinity of the second recess, the field effect transistor is of the normally-on type because the two-dimensional electron gas layer is formed (i.e., current flows) while the off-voltage is applied to the gate 5, or the gate 5 is floating.

Regarding the first recess 8, it is desirable to see a paragraph [0020] in Patent Document 2, specifically, "In a range C1 corresponding to the first recess 8, a semiconductor layer 16 has no heterojunction surface. Thus, in the range C1, the two-dimensional electron gas layer is not formed in the semiconductor layer 16 due to a difference in the bandgap . . . . When no on-voltage is applied to the gate 5, the voltage of the gate 5 becomes a ground voltage with no accumulation layer formed in a first channel C1, whereby electrons cannot move through the first channel C1". In the vicinity of the first recess 8 (range C), the field effect transistor is of the normally-off type because electrons cannot move (i.e., current does not flow) while the on-voltage is not applied to the gate 5.

Referring to, for example, FIG. 1 and a paragraph [0065] in Patent Document 3, it shows "In this way, a first gate electrode 10 and a second gate electrode 20 are operated in the normally-on manner, which simplifies the structure of the semiconductor device and makes the manufacture thereof easier . . . . However, the embodiment is not limited thereto, and alternatively, the second gate electrode 20 may be operated in the normally-off manner." As mentioned above, this patent document discloses that the first gate electrode 10 is operated in the normally-on manner, while the second gate electrode 20 is operated in the normally-off manner.

Note that Patent Document 4 also discloses a combination of the normally-off type field effect transistor and the normally-on type field effect transistor (see, for example, Abstract).

As described above, in the field effect transistor including the combination of the normally-off type field effect transistor and the normally-on type field effect transistor, a drain-to-source voltage applied to the normally-off type field effect transistor becomes approximately equal to a difference between the threshold voltage (0 V or a positive value) of the normally-off type and the threshold voltage (a negative value) of the normally-on type.

CITATION LIST

Patent Document

PATENT DOCUMENT 1: U.S. Pat. No. 8,587,031
PATENT DOCUMENT 2: JP 2012-156164
PATENT DOCUMENT 3: JP 2012-195506
PATENT DOCUMENT 4: U.S. Pat. No. 4,663,547

SUMMARY OF THE INVENTION

However, like the above-mentioned related art, in the field effect transistor including the combination of the normally-off type field effect transistor and the normally-on type field effect transistor, a drain-to-source voltage applied to the normally-off type field effect transistor tends to become large.

Therefore, it is an object of the present invention to include a normally-off type field effect transistor, but to reduce a drain-to-source voltage applied thereto.

According to the present invention, a semiconductor device includes: a semiconductor layer; a source electrode provided in the semiconductor layer; a drain electrode provided in the semiconductor layer and disposed away from the source electrode; a first gate electrode provided between the source electrode and the drain electrode; and a second gate electrode provided between the source electrode and the drain electrode, the second gate electrode having at least a part thereof located closer to the drain electrode than the first gate electrode, the semiconductor layer including: a first facing part that is a part facing the first gate electrode; and a second facing part that is a part facing the second gate electrode, wherein the first facing part does not conduct when a first gate voltage is 0 V or less, the first gate voltage being a potential difference between the source electrode and the first gate voltage, wherein the second facing part does not conduct when a second gate voltage is 0 V or less, the second gate voltage being a potential difference between the second gate electrode and a part located between the first facing part and the second facing part, and wherein the first gate voltage at which the first facing part begins to conduct is larger than the second gate voltage at which the second facing part begins to conduct.

According to the thus constructed semiconductor device, a source electrode is provided in the semiconductor layer. A drain electrode is provided in the semiconductor layer and is disposed away from the source electrode. A first gate electrode is provided between the source electrode and the drain electrode. A second gate electrode is provided between the source electrode and the drain electrode, the second gate electrode having at least a part thereof located closer to the drain electrode than the first gate electrode. The semiconductor layer includes: a first facing part that is a part facing the first gate electrode; and a second facing part that is a part facing the second gate electrode. The first facing part does not conduct when a first gate voltage is 0 V or less, the first gate voltage being a potential difference between the source electrode and the first gate voltage. The second facing part does not conduct when a second gate voltage is 0 V or less, the second gate voltage being a potential difference between the second gate electrode and a part located between the first facing part and the second facing part. The first gate voltage at which the first facing part begins to conduct is larger than the second gate voltage at which the second facing part begins to conduct.

According to the semiconductor device of the present invention, one or both of a part between the first facing part and the first gate electrode and a part between the second facing part and the second gate electrode may be doped with fluoride ions.

According to the semiconductor device of the present invention, at least one of the first gate electrode and the second gate electrode may be P-type gate.

According to the semiconductor device of the present invention, the semiconductor layer may have a concave part, and at least one of the first gate electrode and the second gate electrode may be formed in the concave part.

According to the semiconductor device of the present invention, a gate length of the first gate electrode may be shorter than a gate length of the second gate electrode.

According to the semiconductor device of the present invention, the first facing part may be located at a deeper position than the second facing part.

According to the semiconductor device of the present invention, the semiconductor layer may include an electron transit layer and an electron supply layer disposed over the electron transit layer, the concave part in which the first gate electrode may be formed passes through the electron supply layer, and the concave part in which the second gate electrode is formed may be formed in the electron supply layer without passing through the electron supply layer.

According to the semiconductor device of the present invention, the first facing part may be disposed inside the second facing part.

According to the semiconductor device of the present invention, the first gate electrode and the second gate electrode may be integrated.

MODES FOR CARRYING OUT THE INVENTION

A description will now be given of embodiments of the present invention referring to drawings.

First Embodiment

Figure 1:
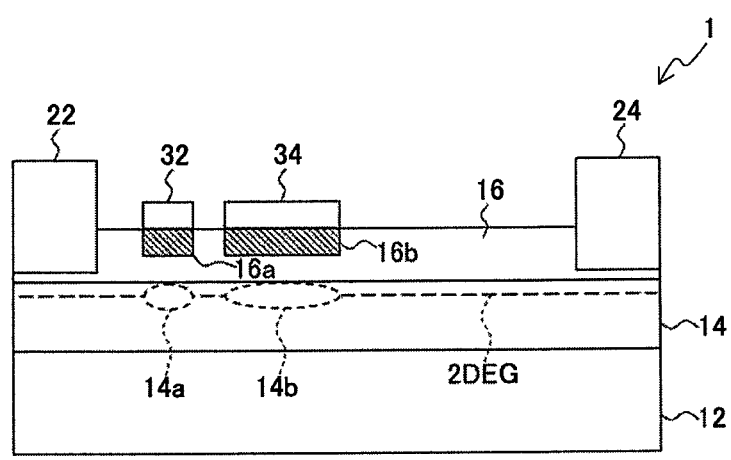
FIG. 1 is a cross-sectional view of a field effect transistor (semiconductor device) 1 according to a first embodiment.

FIG. 1 is a cross-sectional view of a field effect transistor (semiconductor device) 1 according to a first embodiment. The field effect transistor (semiconductor device) 1 according to the first embodiment includes a substrate 12, semiconductor layers 14 and 16, a source electrode 22, a drain electrode 24, a first gate electrode 32, and a second gate electrode 34.

The substrate 12 is, for example, a SiC substrate.

The semiconductor layers 14 and 16 have the electron transit layer 14 disposed on the substrate 12 and the electron supply layer 16 disposed on the electron transit layer 14. Material for the electron transit layer 14 is, for example, GaN. Material for the electron supply layer 16 is, for example, AlGaN. Two-dimensional electron gas (2DEG) is generated at an interface, on the side of the electron transit layer 14, between the electron transit layer 14 and the electron supply layer 16. Note that when each of a first gate voltage and a second gate voltage is 0 V or less, no two-dimensional electron gas (2DEG) is generated at a first facing part 14*a* and a second facing part 14*b* to be described later.

The source electrode 22 and the drain electrode 24 are provided in the electron supply layer 16. The drain electrode 24 is disposed apart from the source electrode 22. For example, the source electrode 22 is disposed on the left end of the electron supply layer 16, while the drain electrode 24 is disposed on the right end of the electron supply layer 16.

The first gate electrode 32 and the second gate electrode 34 are disposed on the electron supply layer 16 and provided between the source electrode 22 and the drain electrode 24. Note that the second gate electrode 34 is located closer to the drain electrode 24 than the first gate electrode 32.

The electron transit layer 14 has the first facing part 14*a* and the second facing part 14*b*. The first facing part 14*a* is a part of the electron transit layer 14 that faces the first gate electrode 32. The second facing part 14*b* is a part of the electron transit layer 14 that faces the second gate electrode 34.

A fluoride ion doped part 16*a* is disposed between the first facing part 14*a* and the first gate electrode 32 and doped with fluoride ions. A fluoride ion doped part 16*b* is disposed between the second facing part 14*b* and the second gate electrode 34 and doped with fluoride ions.

Figure 2:
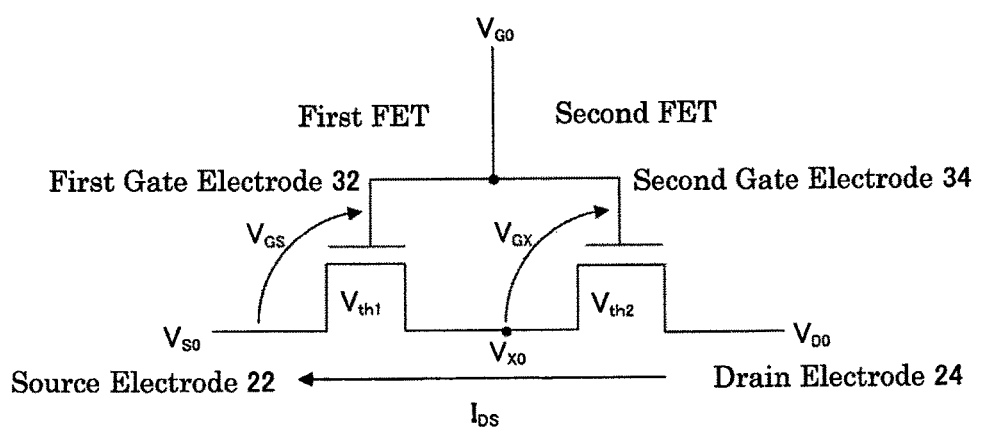
FIG. 2 is a diagram illustrating an equivalent circuit of the field effect transistor 1 according to the first embodiment.

Here, a first gate voltage $V_{GS}$ is defined as a potential difference between the source electrode 22 and the first gate electrode 32 (see FIG. 2). A second gate voltage $V_{GX}$ is defined as a potential difference between the second gate electrode 34 and a part located between the first facing part 14*a* and the second facing part 14*b* (see FIG. 2).

When the first gate voltage is negative, the first facing part 14*a* does not conduct by the influence of the fluoride ion doped part 16*a*. When the second gate voltage is negative, the second facing part 14*b* does not conduct by the influence of the fluoride ion doped part 16*b*.

The first gate voltage (threshold voltage) $V_{th1}$ at which the first facing part 14*a* begins to conduct is larger than the second gate voltage (threshold voltage) $V_{th2}$ at which the second facing part 14*b* begins to conduct.

Next, an operation of the field effect transistor (semiconductor device) 1 according to the first embodiment will be described.

FIG. 2 is a diagram illustrating an equivalent circuit of the field effect transistor 1 according to the first embodiment. The field effect transistor 1 according to the first embodiment is equivalent to the cascode connection of two field effect transistors (first FET and second FET).

In the first FET, the gate is the first gate electrode 32; the source is the source electrode 22; and the drain is the part located between the first facing part 14*a* and the second facing part 14*b*. In the second FET, the gate is the second gate electrode 34; the source is the part located between the first facing part 14*a* and the second facing part 14*b*; and the drain is the drain electrode 24. The drain of the first FET is connected to the source of the second FET. The drain current in the first FET is equal to the drain current in the second FET, i.e., $I_{DS}$.

Further, $V_{S0}$ is a potential of the source electrode 22; $V_{G0}$ is a potential of each of the first gate electrode 32 and the second gate electrode 34; $V_{D0}$ is a potential of the drain electrode 24; and $V_{X0}$ is a potential of the part located between the first facing part 14*a* and the second facing part 14*b*.

Here, an operation of the field effect transistor 1 in the on state according to the first embodiment will be described. Note that the field effect transistor 1 operates in a saturation region.

The potentials of the source and the gate in the second FET satisfy formula (1) below. Further, the potentials of the source and the gate in the first FET satisfy formula (2) below. Since each of the left-hand side of formula (1) and the left-hand side of formula (2) is $V_{G0}$, the right-hand side of formula (1) is equal to the right-hand side of formula (2), whereby formula (3) below is satisfied.

$$V_{G0}=V_{X0}+V_{GX} \tag{1}$$

$$V_{G0}=V_{S0}+V_{GS} \tag{2}$$

$$V_{X0}+V_{GX}=V_{S0}+V_{GS} \tag{3}$$

Here, how to set the reference (0 V) of the potential regarding the respective electrodes is arbitrary, but $V_{S0}$ is generally set at 0 V (as the reference). Therefore, by substituting $V_{S0}=0$ V into formula (3), $V_{X0}$ is solved to obtain formula (4).

$$V_{X0}=V_{GS}-V_{GX} \tag{4}$$

Figure 3:
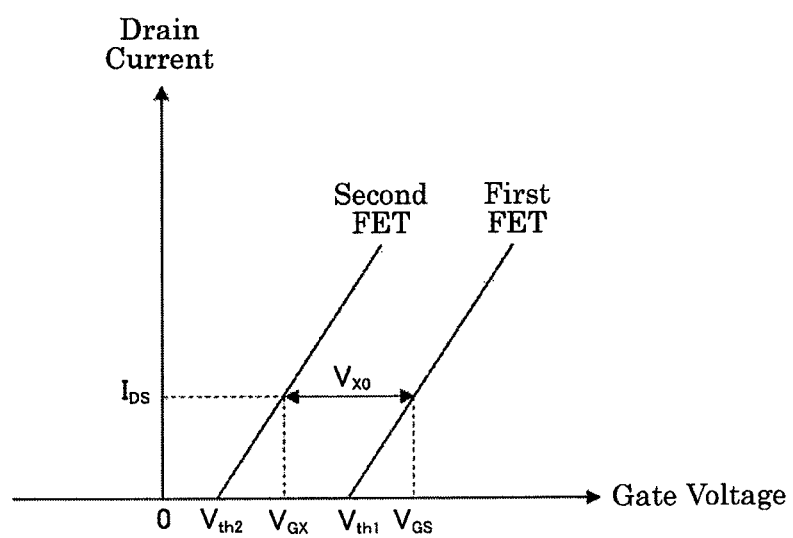
FIG. 3 is a diagram showing gate-voltage to drain-current characteristics of the equivalent circuit illustrated in FIG. 2.

FIG. 3 is a diagram showing gate-voltage to drain-current characteristics of the equivalent circuit illustrated in FIG. 2. Note that for easy explanation, FIG. 3 assumes that the first FET and the second FET have the same transconductance. In this case, a gradient of the gate-voltage to drain-current characteristic of the first FET in an area where a gate voltage of the first FET exceeds the threshold voltage $V_{th1}$ is equal to a gradient of the gate-voltage to drain-current characteristic of the second FET in an area where a gate voltage of the second FET exceeds the threshold voltage $V_{th2}$.

As illustrated in FIG. 3, the gate voltages in the first FET and the second FET with their drain currents set at $I_{DS}$ are a first gate voltage $V_{GS}$ and a second gate voltage $V_{GX}$, respectively. Thus, as illustrated in FIG. 3, $V_{X0}$ is a difference between values on the X coordinate (the coordinate on the horizontal axis) in the first FET and the second FET, respectively, which correspond to the $I_{DS}$ value on the Y coordinate (the coordinate on the vertical axis) in the gate-voltage to drain-current characteristics of the first FET and second FET.

Therefore, $V_{X0}$ is equal to a difference $V_{th1}-V_{th2}$ between values on the X coordinate (the coordinate on the horizontal axis) in the first FET and the second FET, respectively, corresponding to the zero value (0) on the Y coordinate (the coordinate on the vertical axis) in the gate-voltage to drain-current characteristics of the first FET and second FET. Consequently, formula (5) below is satisfied.

$$V_{X0}=V_{th1}-V_{th2} \quad (5)$$

Figure 4:
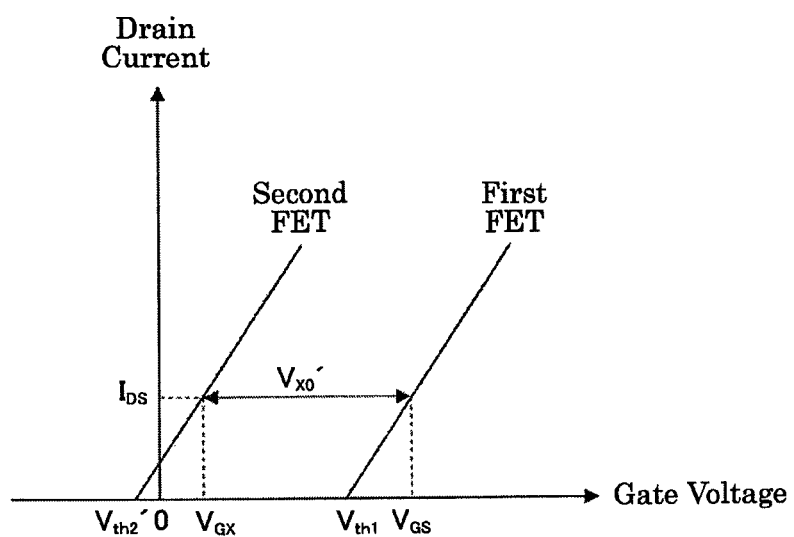
FIG. 4 is a diagram showing the gate-voltage to drain-current characteristics of a field effect transistor that includes a combination of a normally-off type field effect transistor and a normally-on type field effect transistor in a comparative example.

FIG. 4 is a diagram showing the gate-voltage to drain-current characteristics of a field effect transistor that includes a combination of a normally-off type field effect transistor and a normally-on type field effect transistor in a comparative example. Note that this comparative example differs from the first embodiment in that a threshold voltage $V_{th2}'$ of the second FET is set at $V_{th2}'<0$ V (normally-on).

This comparative example shows a combination of the first FET with $V_{th1}>0$ V (normally-off) and the second FET with $V_{th2}'<0$ V (normally-on), which is the same as that described in each of Patent Documents 1 to 4. When $V_{X0}'$ is a potential of a part located between a first facing part 14a and a second facing part 14b in the comparative example, $V_{X0}'$ becomes a value of $V_{th1}-V_{th2}'$ in the same manner as in the first embodiment. Because of $V_{th2}>V_{th2}'$, $V_{x0}'$ is larger than $V_{X0}$ (formula (6)).

$$V_{X0}'>V_{X0} \quad (6)$$

As mentioned above. $V_{S0}$ is generally set at 0 V. Then, $V_{X0}$ is the drain-to-source voltage applied to the first FET in the first embodiment, while $V_{X0}'$ is the drain-to-source voltage applied to the first FET in the comparative example.

According to the first embodiment, the drain-to-source voltage $V_{X0}$ (see FIGS. 2 and 3) applied to the normally-off type field effect transistor (first FET), included in the field effect transistor of the first embodiment, can be set smaller than the drain-to-source voltage $V_{X0}'$ applied to a normally-off type field effect transistor in a field effect transistor (comparative example: see FIG. 4) (like Patent Documents 1 to 4) which includes a combination of the normally-off type field effect transistor and a normally-on type field effect transistor.

Note that the drain-to-source voltage $V_{X0}$ applied to the first FET according to the first embodiment is constant at $V_{th1}-V_{th2}$, even though the drain voltage increases. Even in the comparative example, the drain-to-source voltage $V_{X0}'$ applied to the first FET is constant at $V_{th1}-V_{th2}'$. However, since $V_{x0}$ is smaller than $V_{x0}'$, the field effect transistor in the first embodiment can withstand a high drain voltage, compared to that in the comparative example. For example, in the comparative example, when $V_{th1}$ is 2 V, and $V_{th2}'$ is −5 V the $V_{X0}'$ is 7 V which is extremely high as the drain voltage to be applied to the first FET. Meanwhile, in the first embodiment, $V_{x0}$ is less than 2 V so that the drain voltage applied to the first FET can be lowered.

According to the first embodiment, a knee voltage and an on-resistance can be lower than those in the field effect transistor (like Patent Documents 1 to 4) including a combination of the normally-off type field effect transistor and the normally-on type field effect transistor.

The knee voltage is a drain-to-source voltage at which the field effect transistor reaches the saturation region. Since the field effect transistor is used in the saturation region, the saturation region is preferably reached even when the drain-to-source voltage is low. Thus, the knee voltage is preferably low.

The on-resistance is a resistance shown when the field effect transistor is in the on state. Assuming that the field effect transistor is used as a switch, it is obvious that the resistance of the switch may as well be low. Thus, the on-resistance is preferably low.

Figure 15:
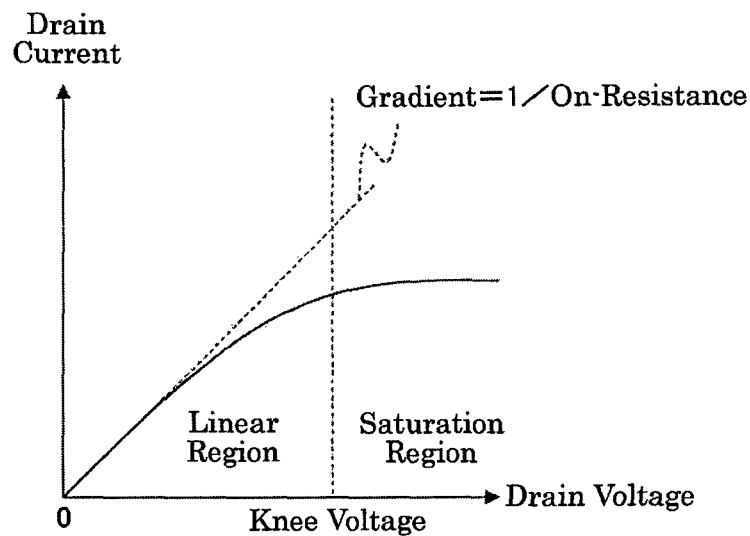
FIGS. 15(*a*) and 15(*b*) illustrate the drain-voltage to drain-current characteristics when the knee voltage is high (FIG. 15(*a*)) and the drain-voltage to drain-current characteristics when the knee voltage is low (FIG. 15(*b*))
Figure 15:
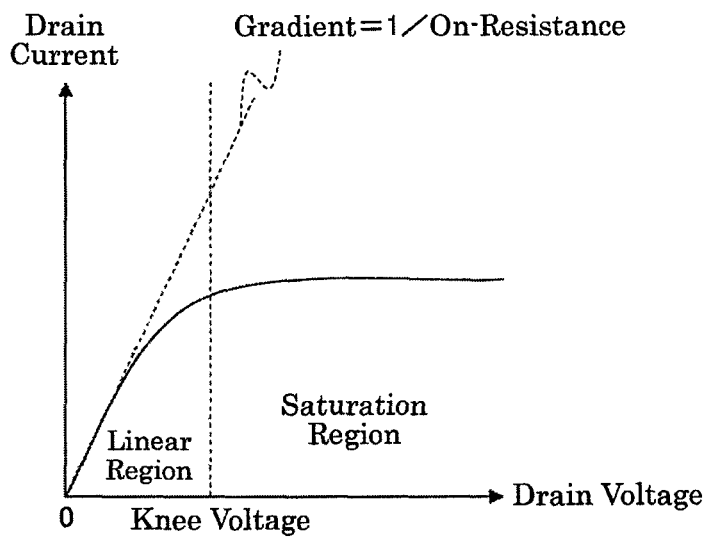

FIG. 15 illustrates the drain-voltage to drain-current characteristics when the knee voltage is high (FIG. 15(a)) and the drain-voltage to drain-current characteristics when the knee voltage is low (FIG. 15(b)). Note that the gate voltage shown in FIG. 15(a) is equal to the gate voltage shown in FIG. 15(b).

Referring to FIG. 15, a gradient of a tangential line near the origin of the drain-voltage to drain-current characteristics is the reciprocal of the on-resistance. Meanwhile, as the knee voltage becomes lower, the gradient of the tangential line near the origin of the drain-voltage to drain-current characteristics is increased, but conversely the on-resistance is decreased.

When the field effect transistor 1 according to the first embodiment reaches the saturation region, the drain current $I_{DS}$ obviously flows as can be seen with reference to FIG. 2. Thus, a relationship of $V_{D0}>V_{X0}$ must be satisfied. Also, in the comparative example, a relationship of $V_{D0}>V_{X0}'$ must be satisfied in the same manner. Since $V_{X0}'$ is larger than $V_{X0}$ (see formula (6)), the drain voltage $V_{D0}$ (knee voltage) at which the field effect transistor 1 according to the first embodiment reaches the saturation region is lower than the drain voltage $V_{D0}$ (knee voltage) at which the field effect transistor in the comparative example (the field effect transistor including the combination of the normally-off type and normally-on type field effect transistors) reaches the saturation region. Then, the on-resistance of the field effect transistor 1 becomes lower than the on-resistance in the comparative example. Note that to lower the on-resistance of the field effect transistor, the resistance per unit gate length of the second FET is preferably reduced.

According to the first embodiment, a capacity $C_{OFF}$ of the field effect transistor 1 at $V_{G0}$ of 0 V can be made smaller, compared to that in the comparative example. For example, in a broadband switch or the like that requires a low product of $R_{ON}$-$C_{OFF}$ (where $R_{ON}$ is an on-resistance), $C_{OFF}$ needs to be small. Thus, it is advantageous that $C_{OFF}$ is small.

Since the comparative example includes the normally-on type field effect transistor, a channel exists in the second facing part 14b even when $V_{G0}$ is 0 V, whereby a capacitive component is generated. Further, in the comparative example, in order to allow the second FET to achieve a high drain breakdown voltage, a gate length is increased. Consequently, its capacitive component becomes considerably large.

However, in the first embodiment, a capacitive component is hardly generated when $V_{G0}$ is 0 V because the first FET and the second FET are of the normally-off type. Thus, $C_{OFF}$ can be made smaller than that in the comparative example.

Next, a description will be given on a method for manufacturing the field effect transistor (semiconductor device) 1 according to the first embodiment.

Figure 8A:
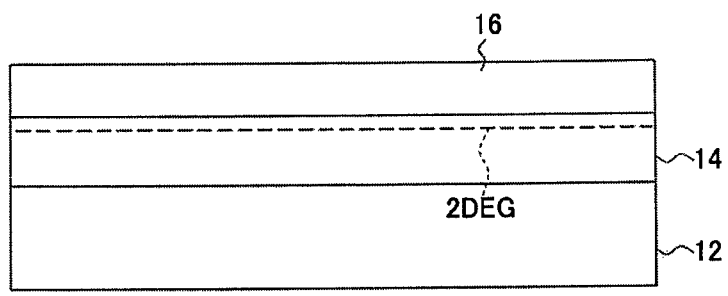
FIGS. 8(a) and 8(b) illustrate a cross-sectional view (FIG. 8(a)) of an epi substrate over which the electron transit layer 14 and the electron supply layer 16 are formed and a cross-sectional view (FIG. 8 (b)) of a product in a manufacturing step in which a source electrode recess 162 and a drain electrode recess 164 are formed in the epi substrate shown in FIG. 8(a)
Figure 8B:
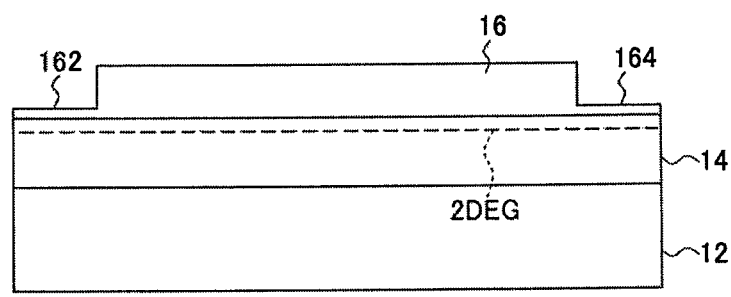

FIG. 8 illustrates a cross-sectional view (FIG. 8(a)) of an epi substrate over which the electron transit layer 14 and the electron supply layer 16 are formed and a cross-sectional view (FIG. 8(b)) of a product in a manufacturing step in which a source electrode recess 162 and a drain electrode recess 164 are formed in the epi substrate shown in FIG. 8(a).

First, as illustrated in FIG. 8(a), the electron transit layer 14 and the electron supply layer 16 are formed over the substrate 12. Then, as illustrated in FIG. 8(b), the source electrode recess 162 is formed at the left end of the epi substrate, while the drain electrode recess 164 is formed at the right end of the epi substrate. The formation of the source electrode recess 162 and the drain electrode recess 164 is performed, for example, by ohmic recess etching on the electron supply layer 16.

Figure 9:
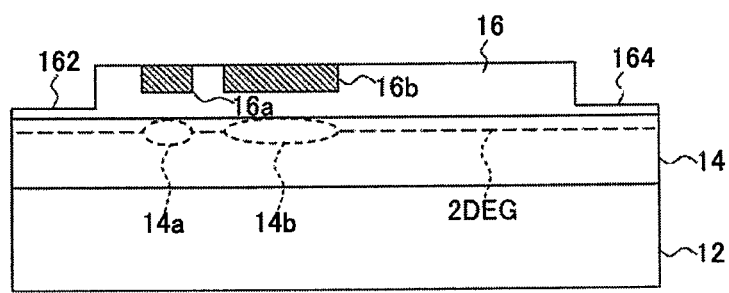
FIG. 9 is a cross-sectional view of a product in a manufacturing step in which the product made in the manufacturing step illustrated in FIG. 8(b) is doped with fluoride ions.

FIG. 9 is a cross-sectional view of a product in a manufacturing step in which the product made in the manufacturing step illustrated in FIG. 8(b) is doped with fluoride ions. The term "product" as used herein is an abbreviation of the field effect transistor 1.

As illustrated in FIG. 9, the electron supply layer 16 of the product made in the manufacturing step illustrated in FIG. 8(b) is doped with fluoride ions to thereby form the fluoride ion doped part 16a and the fluoride ion doped part 16b.

Figure 10A:
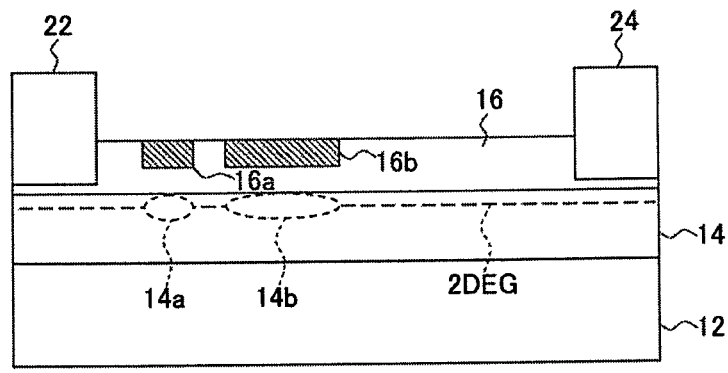
FIGS. 10(a) and 10(b) illustrate a cross-sectional view (FIG. 10(a)) of a product in a manufacturing step in which the source electrode 22 and the drain electrode 24 are formed at the product made in the manufacturing step illustrated in FIG. 9 and a cross-sectional view (FIG. 10(b)) of the field effect transistor 1 (finished product) in which the first gate electrode 32 and the second gate electrode 34 are formed at the product made in the manufacturing step illustrated in FIG. 10(a)
Figure 10B:
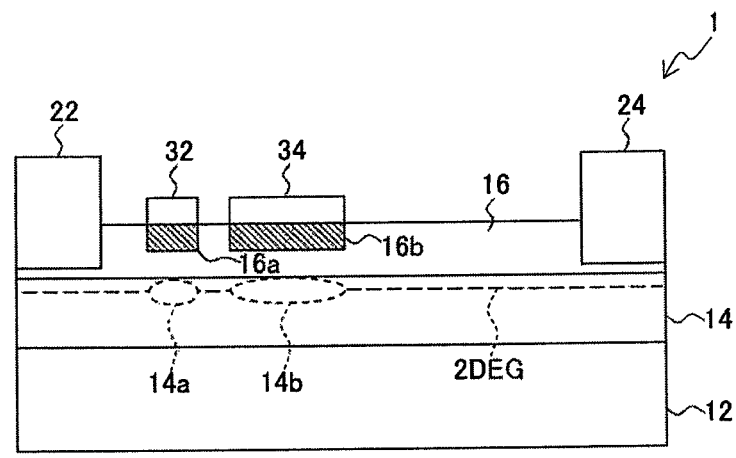

FIG. 10 illustrates a cross-sectional view (FIG. 10(a)) of a product in a manufacturing step in which the source electrode 22 and the drain electrode 24 are formed at the product made in the manufacturing step illustrated in FIG. 9 and a cross-sectional view (FIG. 10(b)) of the field effect transistor 1 (finished product) in which the first gate electrode 32 and the second gate electrode 34 are formed at the product made in the manufacturing step illustrated in FIG. 10(a).

Then, as illustrated in FIG. 10(a), the source electrode 22 is formed in the source electrode recess 162, and the drain electrode 24 is formed in the drain electrode recess 164 in the product made in the manufacturing step illustrated in FIG. 9. Finally, as illustrated in FIG. 10(b), the first gate electrode 32 is formed directly on the fluoride ion doped part 16a, and the second gate electrode 34 is formed directly on the fluoride ion doped part 16b. Note that a surface protective film (not shown) may be formed over the electron supply layer 16, the first gate electrode 32, and the second gate electrode 34.

Second Embodiment

A field effect transistor (semiconductor device) 1 according to a second embodiment differs from that in the first embodiment in that a first gate electrode and a second gate electrode are P-type gates.

Figure 5:
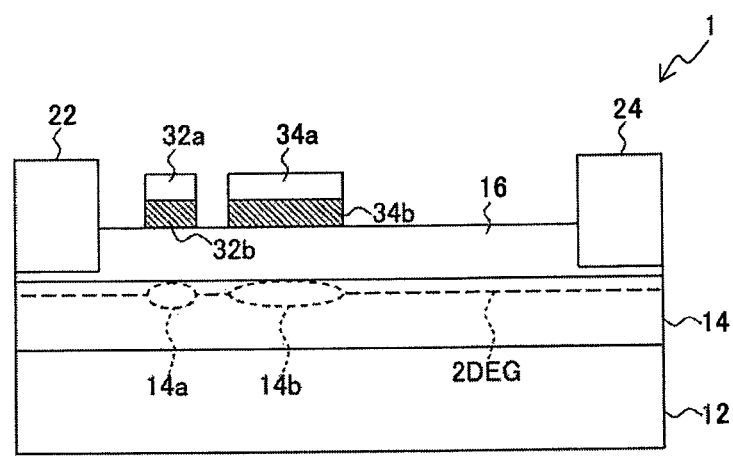
FIG. 5 is a cross-sectional view of the field effect transistor (semiconductor device) 1 according to the second embodiment.

FIG. 5 is a cross-sectional view of the field effect transistor (semiconductor device) 1 according to the second embodiment. The field effect transistor (semiconductor device) 1 according to the second embodiment includes the substrate 12, the semiconductor layers 14 and 16, the source electrode 22, the drain electrode 24, a first gate electrode (a first electrode part 32a and a P-type semiconductor 32b), and a second gate electrode (second electrode part 34a and a P-type semiconductor 34b). In the following, the same parts as those in the first embodiment are denoted by the same reference characters as those in the first embodiment, and thus a description thereof will be omitted below.

The substrate 12, the semiconductor layers 14 and 16, the source electrode 22, and the drain electrode 24 in the present embodiment are substantially the same as those in the first embodiment, and thus a description thereof will be omitted below.

The first electrode part 32a and the P-type semiconductor 32b configure the first gate electrode. The first gate electrode is a P-type gate. The P-type semiconductor 32b is made of, for example, GaN, AlGaN, or InGaN. The P-type semiconductor 32b is formed on the electron supply layer 16, and the first electrode part 32a is formed on the P-type semiconductor 32b.

The second electrode part 34a and the P-type semiconductor 34b configure the second gate electrode. The second gate electrode is a P-type gate. The P-type semiconductor 34b is made of, for example, GaN, AlGaN, or InGaN. The P-type semiconductor 34b is formed on the electron supply layer 16, and the second electrode part 34a is formed on the P-type semiconductor 34b.

The operation of the field effect transistor 1 according to the second embodiment is the same as that in the first embodiment, and a description thereof will be omitted below. Even the second embodiment exhibits the same effects as those in the first embodiment.

Next, a description will be given on a method for manufacturing the field effect transistor (semiconductor device) 1 according to the second embodiment.

The steps until the source electrode recess 162 and the drain electrode recess 164 are formed in the epi substrate are the same as those in the first embodiment, and thus a description thereof will be omitted (see FIG. 8).

Figure 11:
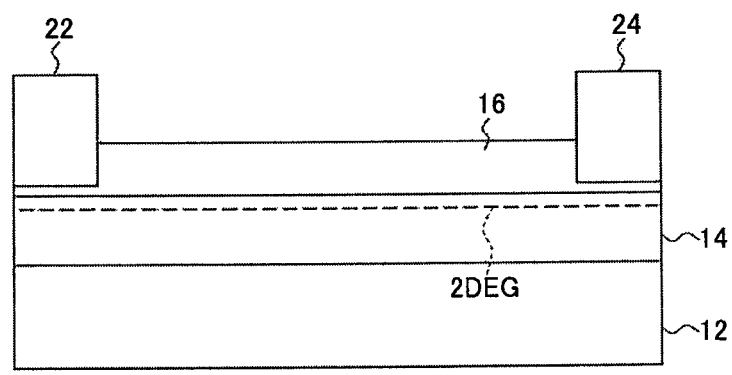
FIG. 11 is a cross-sectional view of a product in a manufacturing step in which the source electrode 22 and the drain electrode 24 are formed in the product made in the manufacturing step illustrated in FIG. 8(b)

FIG. 11 is a cross-sectional view of a product in a manufacturing step in which the source electrode 22 and the drain electrode 24 are formed in the product made in the manufacturing step illustrated in FIG. 8(b).

As illustrated in FIG. 11, the source electrode 22 is formed in the source electrode recess 162, and the drain electrode 24 is formed in the drain electrode recess 164 in the product made in the manufacturing step illustrated in FIG. 8(b).

Figure 12A:
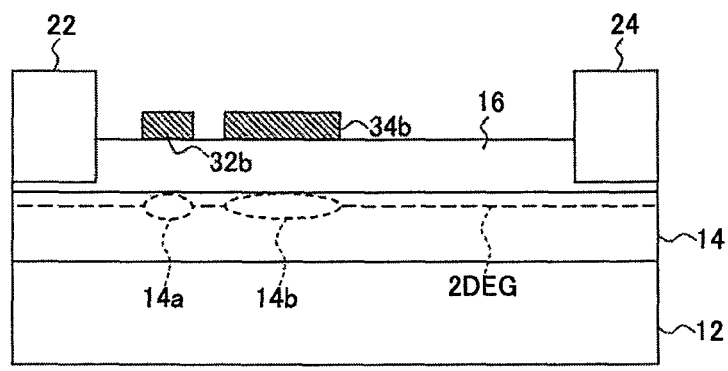
FIGS. 12(a) and 12(b) illustrate a cross-sectional view (FIG. 12(a)) of the product in a manufacturing step in which the P-type semiconductors 32b and 34b are formed at the product made in the manufacturing step illustrated in FIG. 11 and a cross-sectional view (FIG. 12(b)) of the field effect transistor 1 (finished product) in which the first electrode part 32a and the second electrode part 34a are formed at the product made in the manufacturing step illustrated in FIG. 12(a)
Figure 12B:
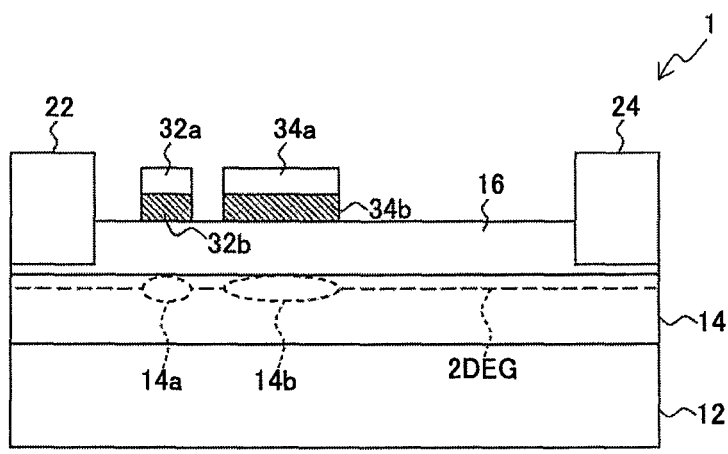

FIG. 12 illustrates a cross-sectional view (FIG. 12(a)) of the product in a manufacturing step in which the P-type semiconductors 32b and 34b are formed at the product made in the manufacturing step illustrated in FIG. 11 and a cross-sectional view (FIG. 12(b)) of the field effect transistor 1 (finished product) in which the first electrode part 32a and the second electrode part 34a are formed at the product made in the manufacturing step illustrated in FIG. 12(a).

As illustrated in FIG. 12(a), P-type semiconductors 32b and 34b are formed on the electron supply layer 16 of the product made in the manufacturing step illustrated in FIG. 11. Finally, as illustrated in FIG. 12(h), a first electrode part 32a and a second electrode part 34a are formed on the P-type semiconductors 32b and 34b, respectively, of the product made in the manufacturing step illustrated in FIG. 12(a). Note that a surface protective film (not shown) may be formed over the electron supply layer 16, the first electrode part 32a, and the second electrode part 34a.

Third Embodiment

A field effect transistor (semiconductor device) 1 according to a second embodiment differs from that in the first embodiment in that the first gate electrode 32 and the second gate electrode 34 are formed in concave parts 160a and 160b, respectively.

Figure 6:
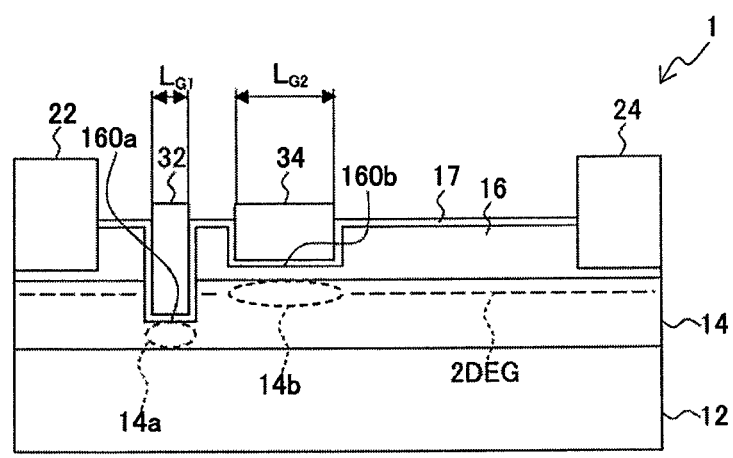
FIG. 6 is a cross-sectional view of the field effect transistor (semiconductor device) 1 according to the third embodiment.

FIG. 6 is a cross-sectional view of the field effect transistor (semiconductor device) 1 according to the third embodiment. The field effect transistor (semiconductor device) 1 according to the third embodiment includes the substrate 12, the semiconductor layers 14 and 16, the source electrode 22, the drain electrode 24, the first gate electrode 32, and the second gate electrode 34. In the following, the same parts as those in the first embodiment are denoted by the same reference characters as those in the first embodiment, and thus a description thereof will be omitted below.

The substrate 12, the semiconductor layers 14 and 16, the source electrode 22, and the drain electrode 24 in the present embodiment are the same as those in the first embodiment, and thus a description thereof will be omitted below.

Figure 13A:
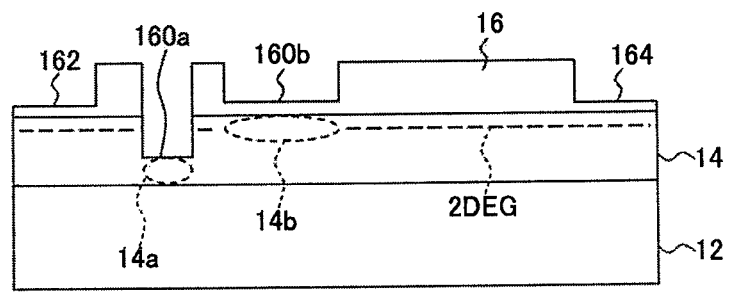
FIGS. 13(a)-13(c) illustrate a cross-sectional view (FIG. 13(a)) of a product in a manufacturing step in which the concave parts 160a and 160b are formed in the product made in the manufacturing step illustrated in FIG. 8(b); a cross section view (FIG. 13(b)) of a product in a manufacturing step in which an insulating film 17 is formed on the product made in the manufacturing step illustrated in FIG. 13(a); and a cross-section view (FIG. 13(c)) of a product in a manufacturing step in which the insulating film 17 located above each of the source electrode recess 162 and the drain electrode recess 164 is removed from the product made in the manufacturing step illustrated in FIG. 13(b)
Figure 13B:
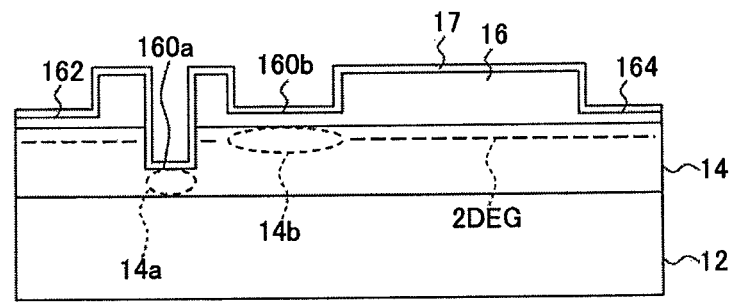
Figure 13C:
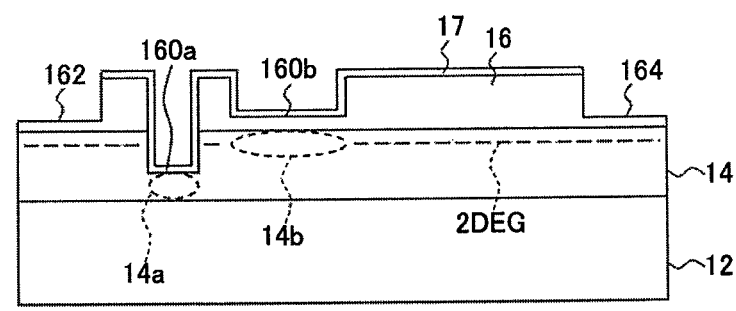
Figure 14:
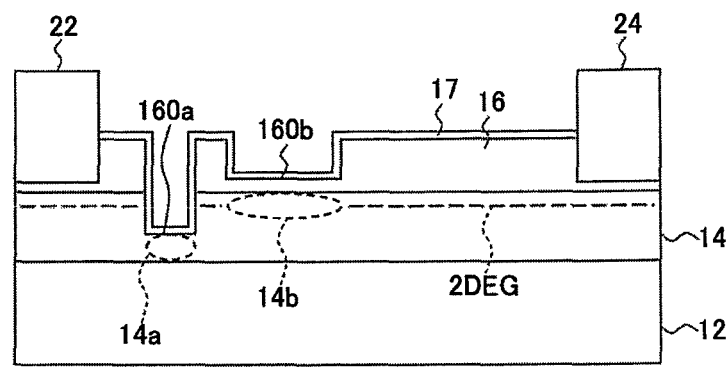
FIGS. 14(a) and 14(b) illustrate a cross-sectional view (FIG. 14(a)) of a product in a manufacturing step in which the source electrode 22 and the drain electrode 24 are formed in the product made in the manufacturing step illustrated in FIG. 13 and a cross-sectional view (FIG. 14(b)) of the field effect transistor 1 (finished product) in which the first gate electrode 32 and the second gate electrode 34 are formed in the product made in the manufacturing step illustrated in FIG. 14(a)

The semiconductor layers 14 and 16 have the concave parts 160a and 160b (see FIGS. 13 and 14).

The first gate electrode 32 is formed in the concave part 160a. The second gate electrode 34 is formed in the concave part 160b. A gate length $L_{G1}$ of the first gate electrode 32 is shorter than a gate length $L_{G2}$ of the second gate electrode 34.

The first facing part 14a is located at a deeper position than the second facing part 14b.

Note that the concave part 160a passes through the electron supply layer 16. The bottom of the concave part 160a is positioned at the electron transit layer 14. The concave part 160b is formed in the electron supply layer 16 without passing through the electron supply layer 16.

The operation of the field effect transistor 1 according to the third embodiment will be the same as that in the first embodiment, and a description thereof will be omitted below. Even the third embodiment exhibits the same effects as those in the first embodiment.

Next, a description will be given on a method for manufacturing the field effect transistor (semiconductor device) 1 according to the third embodiment.

The steps until the source electrode recess 162 and the drain electrode recess 164 are formed in the epi substrate are the same as those in the first embodiment, and thus a description will be omitted (see FIG. 8).

FIG. 13 illustrates a cross-sectional view (FIG. 13(a)) of a product in a manufacturing step in which the concave parts 160a and 160b are formed in the product made in the manufacturing step illustrated in FIG. 8(b); a cross section view (FIG. 13(b)) of a product in a manufacturing step in which an insulating film 17 is formed on the product made in the manufacturing step illustrated in FIG. 13(a); and a cross-section view (FIG. 13(c)) of a product in a manufacturing step in which the insulating film 17 located above each of the source electrode recess 162 and the drain electrode recess 164 is removed from the product made in the manufacturing step illustrated in FIG. 13(b).

As illustrated in FIG. 13(a), the concave part 160a is formed in the electron transit layer 14 and the electron supply layer 16 of the product made in the manufacturing step illustrated in FIG. 8(b), while the concave part 160b is formed in the electron supply layer 16. The formation of the concave parts 160a and 160b is performed, for example, by recess etching the electron transit layer 14 and the electron supply layer 16.

Further, as illustrated in FIG. 13(b), the insulating film 17 is formed on the product made in the manufacturing step illustrated in FIG. 13(a). The insulating film 17 is made of, for example, $Al_2O_3$.

Furthermore, as illustrated in FIG. 13(c), the insulating film 17 formed on each of the source electrode recess 162 and the drain electrode recess 164 in the product made in the manufacturing step illustrated in FIG. 13(b) is removed.

Figure 14B:
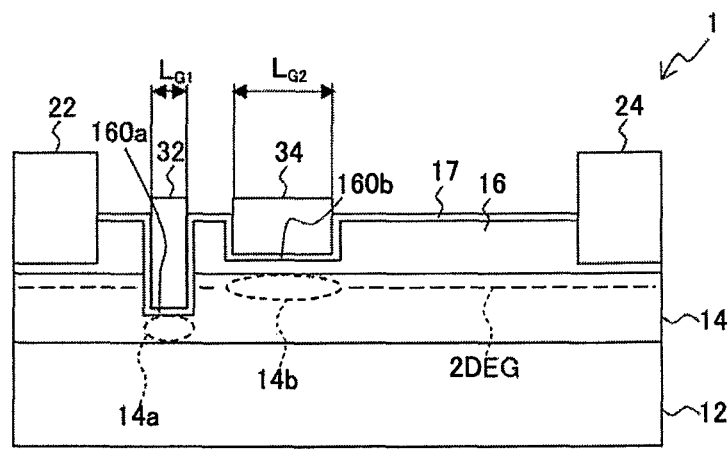

FIG. 14 illustrates a cross-sectional view (FIG. 14(a)) of a product in a manufacturing step in which the source electrode 22 and the drain electrode 24 are formed in the product made in the manufacturing step illustrated in FIG. 13 and a cross-sectional view (FIG. 14(b)) of the field effect transistor 1 (finished product) in which the first gate electrode 32 and the second gate electrode 34 are formed in the product made in the manufacturing step illustrated in FIG. 14(a).

As illustrated in FIG. 14(a), the source electrode 22 is formed in the source electrode recess 162, and the drain electrode 24 is formed in the drain electrode recess 164 in the product made in the manufacturing step illustrated in FIG. 13(c). Finally, as illustrated in FIG. 14(b), the first gate electrode 32 is formed in the concave part 160a, and the second gate electrode 34 is formed in the concave part 160b. Note that a surface protective film (not shown) may be formed over the electron supply layer 16, the first gate electrode 32, and the second gate electrode 34.

Note that although in the third embodiment, the first gate electrode 32 and the second gate electrode 34 are separated from each other, the first gate electrode 32 and the second gate electrode 34 can be integrated.

Figure 7:
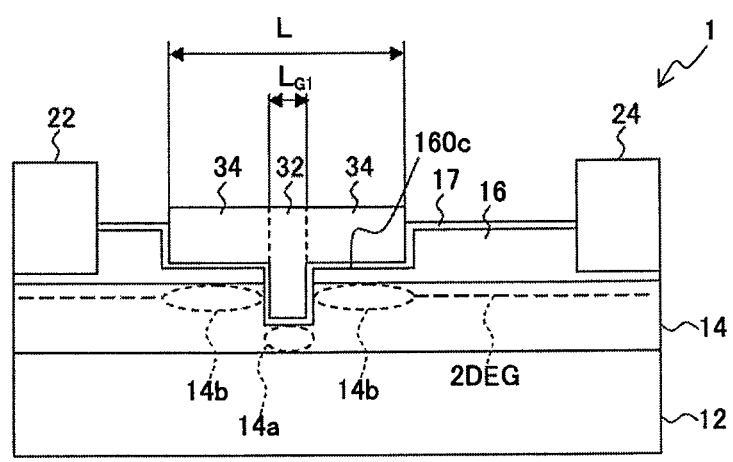
FIG. 7 is a cross-sectional view of a field effect transistor (semiconductor device) 1 according to a modification of the third embodiment.

FIG. 7 is a cross-sectional view of a field effect transistor (semiconductor device) 1 according to a modification of the third embodiment. In the modification of the third embodiment, the first gate electrode 32 and the second gate electrode 34 are integrated. More specifically, the second gate electrodes 34 are formed in contact with the first gate electrode 32 and on the left side and the right side of the first gate electrode 32. A part of the second gate electrode 34 (part on the right side of the first gate electrode 32) is located closer to the drain electrode 24 than the first gate electrode 32.

When L is a length of the structure formed by integrating the first gate electrode 32 and the second gate electrode 34, and $L_{G1}$ is a gate length of the first gate electrode 32, a gate length $L_{G2}$ of the second gate electrode 34 is represented by $L-L_{G1}$. Note that the condition of $L_{G1}<L_{G2}$ is the same in the third embodiment.

Note that the first facing part 14a is disposed inside the second facing part 14b. A concave part 160c is provided in the semiconductor layers 14 and 16.

Fourth Embodiment

The first to third embodiments have described that in both the first FET and the second FET, (1) these FETs are doped with fluoride ions (first embodiment); (2) the P-type gates are mounted (second embodiment); and (3) concave parts are formed (third embodiment). That is, the first to third embodiments have described that the first FET and the second FET are mounted by the same method.

However, the fourth embodiment differs from the first to third embodiments in that the first FET and the second FET are mounted by different methods (for example, a concave part is firmed in the first FET (like the third embodiment), and the second FET is doped with fluoride ions (like the first embodiment)).

Figure 16:
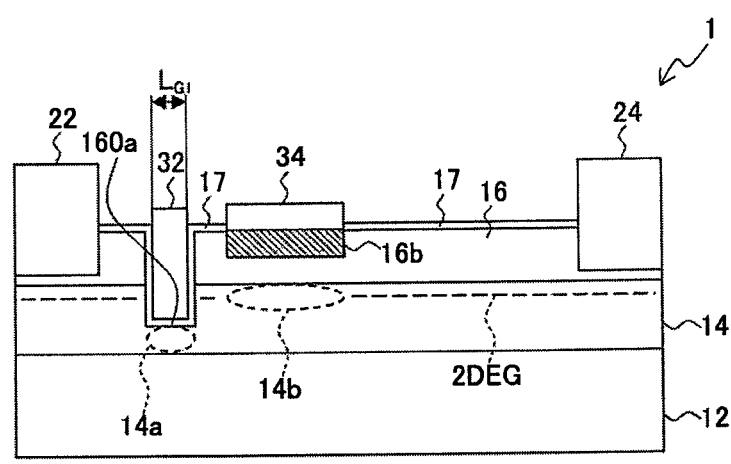
FIG. 16 is a cross-sectional view of a field effect transistor (semiconductor device) 1 according to a fourth embodiment.

FIG. 16 is a cross-sectional view of a field effect transistor (semiconductor device) 1 according to a fourth embodiment. The field effect transistor (semiconductor device) 1 according to the third embodiment includes the substrate 12, the semiconductor layers 14 and 16, the source electrode 22, the drain electrode 24, the first gate electrode 32, and the second gate electrode 34. In the following, the same parts as those in the first and third embodiments are denoted by the same reference characters as those in the first and third embodiments, and thus a description thereof will be omitted below.

The second gate electrode 34 and the fluoride ion doped part 16b are substantially the same as that in the first embodiment, and thus a description thereof will be omitted (see FIG. 1).

The first gate electrode 32 and the concave part 160a are substantially the same as that in the third embodiment, and thus a description thereof will be omitted (see FIG. 6).

The fourth embodiment exhibits the same effects as those in the first embodiment.

Note that (4) although the example has been described in which the concave part is formed in the first FET, and the second FET is doped with fluoride ions, other variations including the first FET and the second FET which are formed by different methods can be proposed.

That is, the following variations can be proposed:

(5) the concave part is formed in the first FET (like the third embodiment), and the P-type gate is mounted in the second FET (like the second embodiment);

(6) the first FET is doped with fluoride ions (like the first embodiment), and the concave part is formed in the second FET (like the third embodiment);

(7) the first FET is doped with fluoride ions (like the first embodiment), and the P-type gate is mounted in the second FET (like the second embodiment);

(8) the P-type gate is mounted in the first FET (like the second embodiment), and the second FET is doped with fluoride ions (like the first embodiment); and (9) the P-type gate is mounted in the first FET (like the second embodiment), and the concave part is formed in the second FET (like the third embodiment).

DESCRIPTION OF REFERENCE NUMERALS

1 Field Effect Transistor (Semiconductor Device)
12 Substrate
14, 16 Semiconductor Layers
14 Electron Transit Layer
14a First Facing Part
14b Second Facing Part
16 Electron Supply Layer
16a, 16b Fluoride Ion Doped Part
22 Source Electrode
24 Drain Electrode
32 First Gate Electrode
32a First Electrode Part
32b P-type Semiconductors
34 Second Gate Electrode
34a Second Electrode Part
34b P-type Semiconductors
160a, 160b, 160c Concave Part
162 Source Electrode Recess
164 Drain Electrode Recess
$L_{G1}$, $L_{G2}$ Gate Length
$V_{GS}$ First Gate Voltage
$V_{GX}$ Second Gate Voltage
$V_{th1}$ First Gate Voltage (Threshold Voltage)
$V_{th2}$ Second Gate Voltage (Threshold Voltage)

The invention claimed is:

1. A semiconductor device comprising:
    a semiconductor layer;
    a source electrode provided in the semiconductor layer;
    a drain electrode provided in the semiconductor layer and spaced from the source electrode;
    a first gate electrode provided between the source electrode and the drain electrode; and
    a second gate electrode provided between the source electrode and the drain electrode, the second gate electrode having at least a part thereof located closer to the drain electrode than the first gate electrode,
    the semiconductor layer including:
        a first facing part that is a part facing the first gate electrode; and
        a second facing part that is a part facing the second gate electrode,
    wherein the first facing part does not conduct when a first gate voltage is 0 V or less, the first gate voltage being a potential difference between the source electrode and the first gate electrode,
    wherein the second facing part does not conduct when a second gate voltage is 0 V or less, the second gate voltage being a potential difference between the second gate electrode and a part of the semiconductor layer located between the first facing part and the second facing part, and
    wherein the first gate voltage at which the first facing part begins to conduct is larger than the second gate voltage at which the second facing part begins to conduct.

2. The semiconductor device according to claim 1, wherein one or both of a part of the semiconductor layer between the first facing part and the first gate electrode and a part of the semiconductor layer between the second facing part and the second gate electrode are doped with fluoride ions.

3. The semiconductor device according to claim 1, wherein at least one of the first gate electrode and the second gate electrode is P-type gate.

4. The semiconductor device according to claim 1, wherein the semiconductor layer has a concave part, and wherein at least one of the first gate electrode and the second gate electrode is formed in the concave part.

5. The semiconductor device according to claim 4, wherein a gate length of the first gate electrode is shorter than a gate length of the second gate electrode.

6. The semiconductor device according to claim 5, wherein the first facing part is located at a deeper position in the semiconductor layer than the second facing part.

7. The semiconductor device according to claim 6, wherein the semiconductor layer further includes an electron transit layer and an electron supply layer disposed over the electron transit layer,
    wherein the concave part in which the first gate electrode is formed passes through the electron supply layer and extends within the electrode transit layer, and
    wherein the concave part in which the second gate electrode is formed is formed in the electron supply layer without passing through the electron supply layer.

8. The semiconductor device according to claim 7, wherein the first facing part is disposed inside the second facing part.

9. The semiconductor device according to claim 7, wherein the first gate electrode and the second gate electrode are integrated.

* * * * *